(12) United States Patent
Matano

(10) Patent No.: US 7,577,045 B2
(45) Date of Patent: Aug. 18, 2009

(54) SEMICONDUCTOR MEMORY DEVICE

(75) Inventor: Tatsuya Matano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 241 days.

(21) Appl. No.: 11/812,863

(22) Filed: Jun. 22, 2007

(65) Prior Publication Data
US 2008/0008014 A1 Jan. 10, 2008

(30) Foreign Application Priority Data
Jul. 7, 2006 (JP) .............................. 2006-187695

(51) Int. Cl.
*G11C 7/00* (2006.01)
(52) U.S. Cl. .............. 365/189.16; 365/206; 365/189.08
(58) Field of Classification Search ............ 365/189.16, 365/206, 189.08
See application file for complete search history.

(56) References Cited

U.S. PATENT DOCUMENTS 7,436,732 B2 * 10/2008 Hirobe ........................ 365/226

FOREIGN PATENT DOCUMENTS

| JP | 52-152128 | 12/1977 |
|----|-----------|---------|
| JP | 63-308790 | 12/1988 |
| JP | 01-155590 | 6/1989 |
| JP | 01-173391 | 7/1989 |
| JP | 10-269771 | 10/1998 |
| JP | 11-086553 | 3/1999 |
| JP | 2001-35164 | 2/2001 |
| JP | 2001-256782 | 9/2001 |
| JP | 2005-222580 | 8/2005 |

* cited by examiner

*Primary Examiner*—Son Dinh
(74) *Attorney, Agent, or Firm*—Young & Thompson

(57) ABSTRACT

A semiconductor memory device includes transistors that supply a higher write potential and a lower write potential to a sense amplifier, respectively, an overdrive transistor that supplies an overdrive potential to the sense amplifier, and a control circuit that changes a gate-source voltage of the overdrive transistor step by step. By raising a potential of one of paired bit lines to the overdrive potential not suddenly but step by step, an influence of a potential increase on the other bit line via a parasitic capacity is lessened and a malfunction caused by data inversion is prevented.

11 Claims, 9 Drawing Sheets

SEMICONDUCTOR MEMORY DEVICE

TECHNICAL FIELD

The present invention generally relates to a semiconductor memory device, and more particularly relates to a semiconductor memory device capable of realizing a high-speed sensing operation.

BACKGROUND OF THE INVENTION

A semiconductor memory device such as a DRAM (Dynamic Random Access Memory) includes a sense amplifier per paired bit lines so as to amplify a weak signal read from each memory cell. The sense amplifier needs to raise a potential of one of the paired bit lines to a higher write potential (high level) and to reduce that of the other bit line to a lower write potential (low level). Due to this, the sense amplifier is structured so that the higher write potential and the lower write potential are supplied to the sense amplifier when the sense amplifier is activated.

In recent years, sense amplifiers are often configured to operate based on an overdrive mechanism to raise the potential of one of the paired bit lines to the higher write potential at higher speed (see Japanese Patent Application Laid-open Nos. 2005-222580, 2001-35164, and H10-269771). The overdrive mechanism is to supply an overdrive potential higher than the higher write potential to the sense amplifier. By structuring the sense amplifier as an overdriven sense amplifier, a sensing operation can be accelerated.

However, if the sense amplifier is structured as the overdriven sense amplifier, noise tends to be superimposed on the other bit line the potential of which is reduced to the lower write potential. Namely, as shown in FIG. 9, if it is assumed that one of physically adjacent bit lines Bi and Bi+1 is driven to the higher write potential (high level) and that the other bit line is driven to the lower write potential (low level), the potential of the bit line Bi+1 adjacent to the bit line Bi is raised via a capacity C1 between the bit lines Bi and Bi+1 when the potential of the bit line Bi is raised to the overdrive potential. Beside the capacity C1, a capacity C2 via many unselected word lines Wx, a capacity C3 via a substrate and the like are present between the bit lines Bi and Bi+1. Due to this, if a signal amount of the bit line Bi+1 is insufficient, data inversion possibly occurs to the bit line Bi+1.

To solve such a problem, a driving capability of a transistor for overdriving the sense amplifier ("overdrive transistor") is designed to be low. In this case, however, the effect of structuring the sense amplifier as the overdriven sense amplifier is greatly reduced, with the result that the sensing operation cannot be sufficiently accelerated.

As described above, if the sense amplifier is structured as the overdriven sense amplifier, it is advantageously possible to accelerate the sensing operation. On the other hand, the data of the other bit line is disadvantageously inverted.

SUMMARY OF THE INVENTION

The present invention has been achieved to solve the conventional disadvantages, and an object of the present invention is to provide a semiconductor memory device capable of realizing a high-speed sensing operation while preventing malfunction due to data inversion by suppressing generation of noise resulting from an overdrive operation.

The above and other objects of the present invention can be accomplished by a semiconductor memory device comprising:

a sense amplifier that supplies a higher write potential to one of a pair of bit line and supplies a lower write potential to other bit line;

a first driver transistor that supplies the higher write potential to the sense amplifier;

a second driver transistor that supplies the lower write potential to the sense amplifier;

an overdrive transistor that supplies an overdrive potential higher than the higher write potential to the sense amplifier; and a control circuit that controls the first driver transistor, the second driver transistor, and the overdrive transistor, the control circuit changes at least one of a gate-source voltage and a gate-drain voltage of the overdrive transistor either step by step or continuously.

According to the present invention, at least one of the gate-source voltage and the gate-drain voltage of the overdrive transistor is changed either step by step or continuously. The overdrive transistor drives the higher-potential drive wiring either step by step or continuously, accordingly. Namely, by raising the potential of one of the paired bit lines to the overdrive potential not suddenly but step by step, an influence of a potential increase on the other bit line via a parasitic capacity is lessened. Besides, the driving capability of the overdrive transistor is improved either step by step or continuously. Therefore, as compared with an instance of setting the driving capability of the overdrive transistor to be low from the beginning, the sense amplifier can perform a high-speed sensing operation.

To enable such control, the power supply voltage of the driver circuit that drives the overdrive transistor may be changed either step by step or continuously, for example. To change the power supply voltage of the driver circuit step by step, a switching circuit that switches at least one of power supply potentials of the driver circuit step by step may be provided. To change the power supply voltage of the driver circuit continuously, a resistor may be connected between the driver circuit and the wiring to which at least one of the power supply potentials is supplied.

Alternatively, the control circuit may include a first power supply transistor connected between a wiring to which the overdrive potential is supplied and the overdrive transistor, and a second power supply transistor connected between a wiring to which an auxiliary potential lower than the overdrive potential is supplied and the overdrive transistor. Further, the second power supply transistor may be turned on before the first power supply transistor is turned on.

According to the present invention, a conduction type of the overdrive transistor can be either a P-channel conduction type or an N-channel conduction type.

As described above, according to the present invention, generation of noise caused by an overdrive operation is suppressed. It is, therefore, possible to realize a high-speed sensing operation while preventing data inversion.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
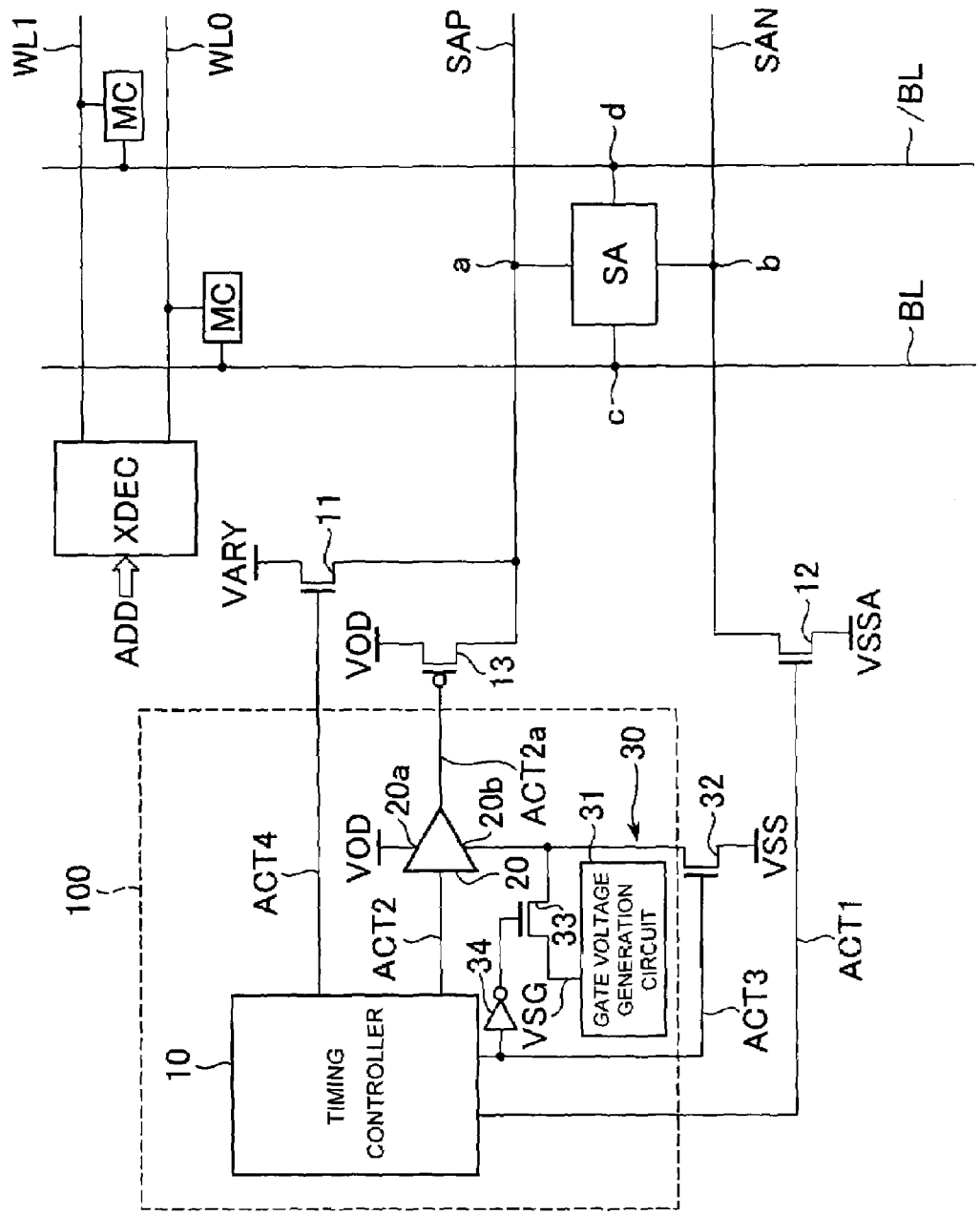
FIG. 1 is a circuit diagram showing principal constituent elements of a semiconductor memory device according to a first embodiment of the present invention.

FIG. 1 is a circuit diagram showing principal constituent elements of a semiconductor memory device according to a first embodiment of the present invention.

The semiconductor memory device according to the first embodiment is, for example, a DRAM. As shown in FIG. 1, memory cells MCs are arranged at intersecting points between a bit line BL and a word line WL0 and those between a bit line /BL and a word line WL1, respectively. The bit lines BL and /BL are paired bit lines. A sense amplifier SA supplies a higher write potential to one of the paired bit lines BL and /BL and a lower write potential to the other bit line. Needless to say, the DRAM actually includes many other bit lines and word lines, and memory cells are arranged at corresponding intersecting points, respectively; however, they are not shown in FIG. 1.

Figure 2:
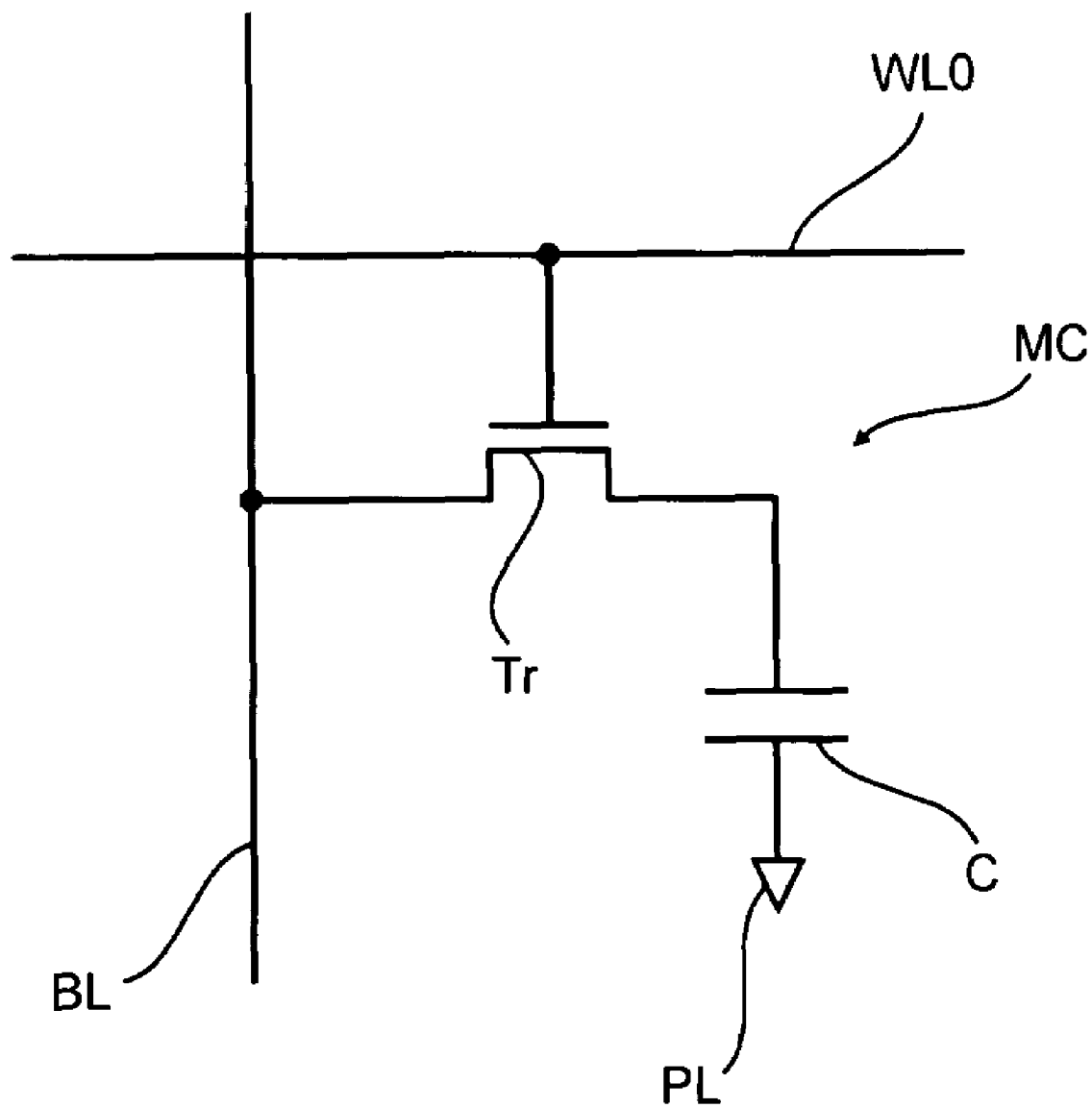
FIG. 2 is a circuit diagram of a memory cell.

As shown in FIG. 2, each memory cell MC is configured to include a cell transistor Tr and a cell capacitor C connected in series between the bit line BL and a plate wiring PL, and a gate electrode of the cell transistor Tr is connected to the corresponding word line WL0. By so configuring, when the word line WL0 becomes high level, the cell transistor Tr is turned on and the cell capacitor C is connected to the corresponding bit line BL. A row decoder XDEC shown in FIG. 1 selects one of a plurality of word lines and a predetermined word line becomes high level according to a value of a row address ADD.

If data is to be written to the memory cell MC, the higher write potential or the lower write potential is supplied to the cell capacitor C of the memory cell MC according to data to be stored in the memory cell MC. As described later, in the first embodiment, the higher write potential is denoted by VARY and set to, for example, 1.4 V, and the lower write potential is denoted by VSSA and set to, for example, 0 V (ground potential).

Meanwhile, if data is to be read from the memory cell MC, the cell transistor Tr is turned on after the bit line BL is precharged with an intermediate potential, i.e., (VARY−VSSA)/2, (e.g., 0.7 V, hereinafter, simply "VARY/2"). By doing so, if the higher write potential is applied to the cell capacitor C, a potential of the bit line BL slightly rises from the intermediate potential VARY/2. If the lower write potential is applied to the cell capacitor C, the potential of the bit line BL slightly falls from the intermediate potential VARY/2.

It is the sense amplifier SA that drives the bit line BL to follow such a data writing or data reading operation.

As shown in FIG. 1, the sense amplifier SA includes four nodes a, b, c, and d. Among these nodes a, b, c, and d, the nodes a and b are power supply nodes and connected to a higher-potential drive wiring SAP and a lower-potential drive wiring SAN, respectively. Further, the nodes c and d are signal nodes and connected to the bit lines BL and /BL, respectively.

Figure 3:
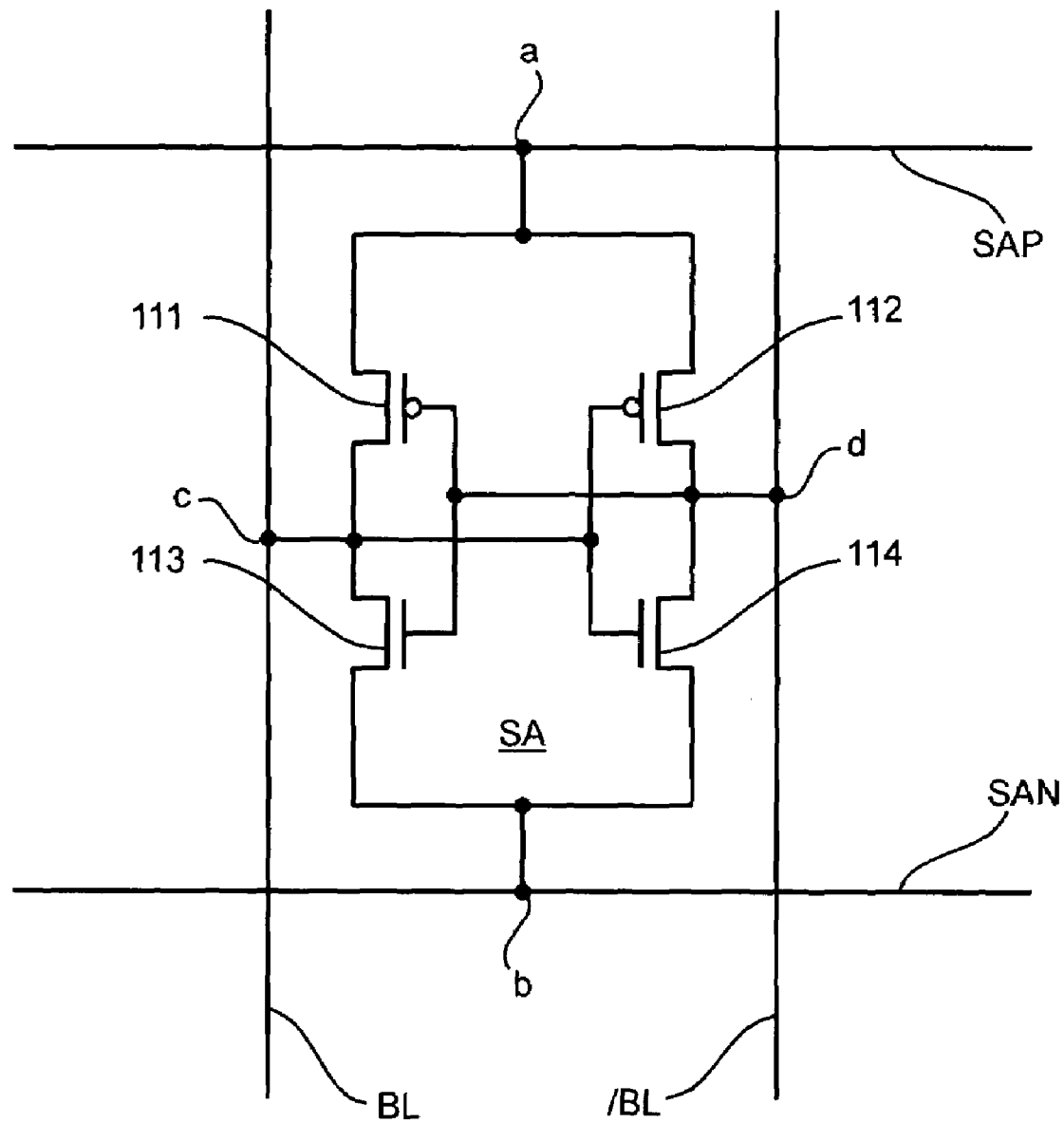
FIG. 3 is a circuit diagram of a sense amplifier.

FIG. 3 is a circuit diagram of the sense amplifier SA.

As shown in FIG. 3, the sense amplifier SA is configured to include P-channel MOS transistors 111 and 112 and N-channel MOS transistors 113 and 114. The P-channel MOS transistor 111 and the N-channel MOS transistor 113 are connected in series between the power supply nodes a and b. A contact between the P-channel MOS transistor 111 and the N-channel MOS transistor 113 is connected to the signal node c, and gate electrodes of the P-channel MOS transistor 111 and the N-channel MOS transistor 113 are both connected to the other signal node d. Likewise, the P-channel MOS transistor 112 and the N-channel MOS transistor 114 are connected in series between the power supply nodes a and b. A contact between the P-channel MOS transistor 112 and the N-channel MOS transistor 114 is connected to the signal node d, and gate electrodes of the P-channel MOS transistor 112 and the N-channel MOS transistor 114 are both connected to the other signal node c.

The sense amplifier SA has such a flip-flop structure. Due to this, if a potential difference is generated between the paired bit lines BL and /BL while predetermined potentials are being supplied to the higher-potential drive wiring SAP and the lower-potential drive wiring SAN, respectively, then the potential of the higher-potential drive wiring SAP is supplied to one of the paired bit lines BL and /BL, and that of the lower-potential drive wiring SAN is supplied to the other bit line. In the first embodiment, the higher write potential VARY is supplied to the higher-potential drive wiring SAP and the lower write potential VSSA is supplied to the lower-potential drive wiring SAN as described later. Moreover, in an initial period of a sensing operation, an overdrive potential VOD higher than the higher write potential VARY is temporarily supplied to the higher-potential drive wiring SAP.

Referring back to FIG. 1, various circuits for driving the sense amplifier SA will be explained.

As shown in FIG. 1, a circuit that drives the higher-potential drive wiring SAP is configured to include a driver transistor 11 that supplies the higher write potential VARY and an overdrive transistor 13 that supplies the overdrive potential VOD. Furthermore, a circuit that drives the lower-potential drive wiring SAN is a driver transistor 12 that supplies the lower write potential VSSA. Operations performed by the transistors 11 to 13 are controlled by a control circuit 100. The control circuit 100 includes a timing controller 10, a driver circuit 20, and a switching circuit 30 to be described later.

As described above, the overdrive potential VOD is a higher potential (e.g., 1.8 V) than the higher write potential VARY and temporarily supplied in the initial period of the sensing operation. In the first embodiment, the driver transistor 11 is an N-channel MOS transistor and the overdrive transistor 13 is a P-channel MOS transistor. However, conduction types of the transistors 11 and 13 are not limited to N-type and P-type, respectively.

The driver transistor 11 is connected between a wiring to which the higher write potential VARY is supplied and the higher-potential drive wiring SAP, and an activation signal ACT4 is supplied from the timing controller 10 to a gate of the driver transistor 11. Therefore, when the driver transistor 11 is turned on, the higher write potential VARY is supplied to the higher-potential drive wiring SAP.

Meanwhile, the overdrive transistor 13 is connected between a wiring to which the overdrive potential VOD is supplied and the higher-potential drive wiring SAP, and an activation signal ACT2 is supplied from the timing controller 10 to a gate of the overdrive transistor 13. The driver circuit 20 is a circuit that drives the overdrive transistor 13. Therefore, an output signal ACT2a of the driver circuit 20 is actually supplied to the gate of the overdrive transistor 13. When the overdrive transistor 13 is turned on, the overdrive potential VOD is supplied to the higher-potential drive wiring SAP. However, because a power supply voltage of the driver circuit 20 is switched when the sense amplifier SA is activated, a driving capability of the overdrive transistor 13 is changed step by step.

An operating voltage of the driver circuit 20 is supplied between power supply nodes 20a and 20b, the power supply node 20a is connected to the overdrive potential VOD, and the power supply node 20b is connected to the switching circuit 30.

As shown in FIG. 1, the switching circuit 30 includes a gate voltage generation circuit 31, a transistor 32 connected between the power supply node 20b and a wiring to which a ground potential VSS is supplied, a transistor 33 connected between the power supply node 20b and the gate voltage generation circuit 31, and an inverter 34.

The gate voltage generation circuit 31 generates an intermediate gate potential VSG higher than the ground potential VSS. A level of the intermediate gate potential VSG is set within a range in which a difference (VOD−VSG) between the intermediate gate potential VSG and the overdrive potential VOD exceeds a threshold voltage of the overdrive transistor 13. An activation signal ACT3 is supplied from the timing controller 10 to a gate of the transistor 32, and an inverted signal of the activation signal ACT3 is supplied to a gate of the transistor 33 by the inverter 34. By doing so, in a period in which the activation signal ACT3 is at high level, the ground potential VSS is supplied to the power supply node 20b of the driver circuit 20. In a period in which the activation signal ACT3 is at low level, the intermediate gate potential VSG is supplied to the power supply node 20b of the driver circuit 20.

Meanwhile, as shown in FIG. 1, the driver transistor 12 that drives the lower-potential drive wiring SAN is connected between a wiring to which the lower write potential VSSA is supplied and the lower-potential drive wiring SAN, and an activation signal ACT1 is supplied from the timing controller 10 to a gate of the driver transistor 12. Therefore, when the driver transistor 11 is turned on, the lower write potential VSSA is supplied to the lower-potential drive wiring SAN.

The lower write potential VSSA is preferably, but not limited to, a potential supplied via an external terminal instead of an internal potential generated within the semiconductor memory device for the following reason. The potential supplied via the external terminal is smaller than the internal potential in potential change caused by an increase of load. Therefore, if the lower write potential VSSA is supplied via the external terminal, a fluctuation in the lower write potential VSSA at start of the sensing operation can be suppressed to some extent. Specifically, the lower write potential VSSA may be set equal to the ground potential VSS.

The configurations of the principal constituent elements of the semiconductor memory device according to the first embodiment have been described so far. Operations performed by the semiconductor memory device according to the first embodiment will next be explained next.

Figure 4:
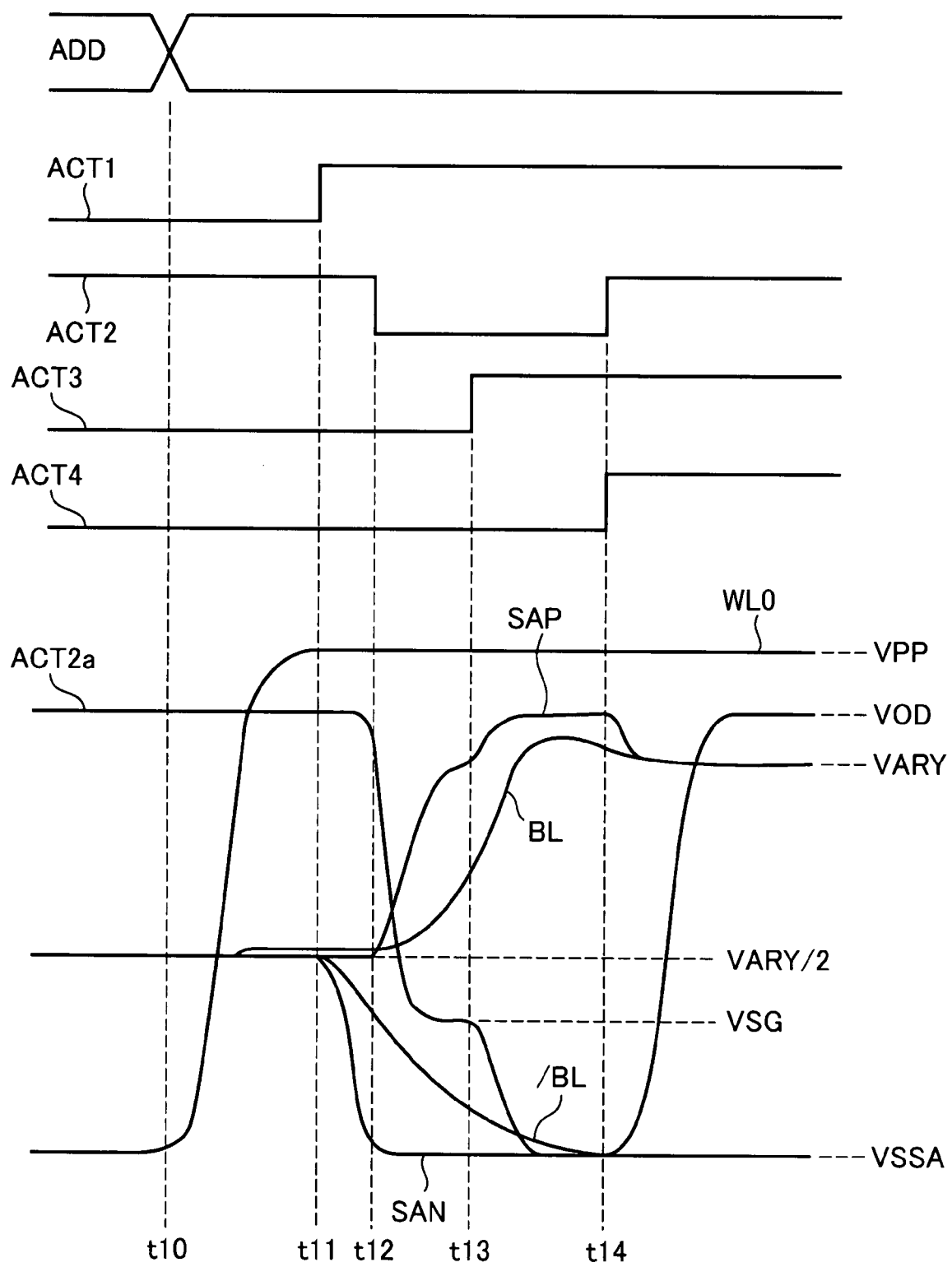
FIG. 4 is a waveform view showing an operation performed by the semiconductor memory device according to the first embodiment of the present invention.

FIG. 4 is a waveform view showing an operation performed by the semiconductor memory device according to the first embodiment.

First, before time t10, the paired bit lines BL and /BL are precharged with VARY/2. At the time t10, when the row address ADD is equal to a predetermined value, a level of the corresponding word line WL0 rises accordingly. The level of the activated word line WL0 is raised up to a higher potential (VPP) than the overdrive potential VOD. As a result, the cell transistor Tr included in each of the memory cells MCs connected to the word line WL0 is turned on, so that the cell capacitor C included in each of the memory cells MC connected to the word line WL0 is shorted to the corresponding bit line BL (or /BL). The potential of the bit line BL (or /BL) is thereby changed. FIG. 4 shows a case where the bit line BL of interest slightly rises from the intermediate potential VARY/2.

At time t11, the activation signal ACT1 is activated to high level. The driver transistor 12 is thereby turned on, so that the lower-potential drive wiring SAN is driven to the lower write potential VSSA. The sense amplifier SA thereby starts the sensing operation. However, at this moment, the higher-potential drive wiring SAP is not driven. Due to this, the sense amplifier SA can reduce the level of only one of the paired bit lines BL and /BL but cannot raise the level of the other bit line. The reason for driving the lower-potential drive wiring SAN prior to driving of the higher-potential drive wiring SAP is as follows. Generally, P-channel MOS transistors are larger in characteristic irregularities than N-channel MOS transistors. Therefore, if the four transistors constituting the sense amplifier SA are actuated simultaneously, the sensing operation performed by the sense amplifier SA may possibly become unstable.

After the driving of the lower-potential drive wiring SAN proceeds to some extent, the activation signal ACT2 is activated to low level at time t12. At this time, the activation signal ACT3 is set to low level. By doing so, the overdrive transistor 13 is turned on. As a result, the higher-potential drive wiring SAP is driven to the overdrive potential VOD, whereby the sensing operation further proceeds. Namely, the sense amplifier SA reduces the level of one of the paired bit lines BL and /BL and raises the level of the other bit line.

It is to be noted, however, that the activation signal ACT3 is at low level at this moment. Due to this, in the switching circuit 30; the transistor 32 is turned off and the transistor 33 is turned on. Accordingly, the intermediate gate potential VSG generated by the gate voltage generation circuit 31 is supplied to the power supply node 20b of the driver circuit 20, and the level of the output signal ACT2a of the driver circuit 20 is equal to the intermediate gate potential VSG. Namely, a gate-source voltage of the overdrive transistor 13 is equal to VOD−VSG. As described above, the difference (VOD−VSG) between the intermediate gate potential VSG and the overdrive potential VOD exceeds the threshold voltage of the overdrive transistor 13. Therefore, although the overdrive transistor 13 is turned on, the gate-source voltage of the overdrive transistor 13 is lower than that if the ground potential VSS is supplied to the gate of the overdrive transistor 13. Due to this, an ON current of the overdrive transistor 13 is restricted to some extent.

Accordingly, the potential of the higher-potential drive wiring SAP is raised up to the overdrive potential VOD not suddenly but relatively gently. This can sufficiently lessen the influence of the potential increase on the adjacent bit line via a parasitic capacity.

After the driving of the higher-potential drive wiring SAP proceeds to some extent, the activation signal ACT3 is changed to high level at time t13. As a result, in the switching circuit 30, the transistor 32 is turned on and the transistor 33 is turned off, whereby the potential applied to the power supply node 20b of the driver circuit 20 is switched to the ground potential VSS. Due to this, the level of the output signal ACT2a of the driver circuit 20 is equal to the ground potential VSS, and the gate-source voltage of the overdrive transistor 13 is equal to VOD-VSS. The driving capability of the overdrive transistor 13 is thereby improved. As a consequence, the higher-potential drive wiring SAP is driven to the overdrive potential VOD more strongly, and the sensing operation further proceeds.

At time t14, the activation signal ACT4 is activated to high level and the activation signal ACT2 is deactivated to high level. The sense amplifier SA finishes an overdrive operation and the higher-potential drive wiring SAP is driven to the higher write potential VARY.

Through these operations, the sense amplifier SA eventually reduces the potential of one of the paired bit lines BL and /BL to the lower write potential VSSA and raises that of the other bit line to the higher write potential VARY. Accordingly, the data destroyed after being read from each memory cell MC is restored.

As described so far, according to the first embodiment, the gate-source voltage of the overdrive transistor 13 is changed in a two-step manner, thereby adjusting the driving capability of the overdrive transistor 13. It is, therefore, possible to suppress generation of noise due to the overdrive operation. It is thereby possible to realize a high-speed sensing operation while preventing data inversion caused by noise.

As a method of improving the driving capability of the overdrive transistor 13 step by step, a method of connecting a plurality of overdrive transistors having different driving capabilities in parallel and of sequentially making the overdrive transistors continuous may be adopted. With this method, however, if the driving capability is to be adjusted in a design phase, it is necessary to change design retroactively to transistor level. According to the first embodiment, by contrast, the driving capability can be adjusted according to the level of the intermediate gate potential VSG. It, therefore, suffices to slightly change a mask pattern of an upper wiring. This can facilitate adjusting the driving capability in the design phase.

A semiconductor memory device according to a second embodiment of the present invention will be explained next.

Figure 5:
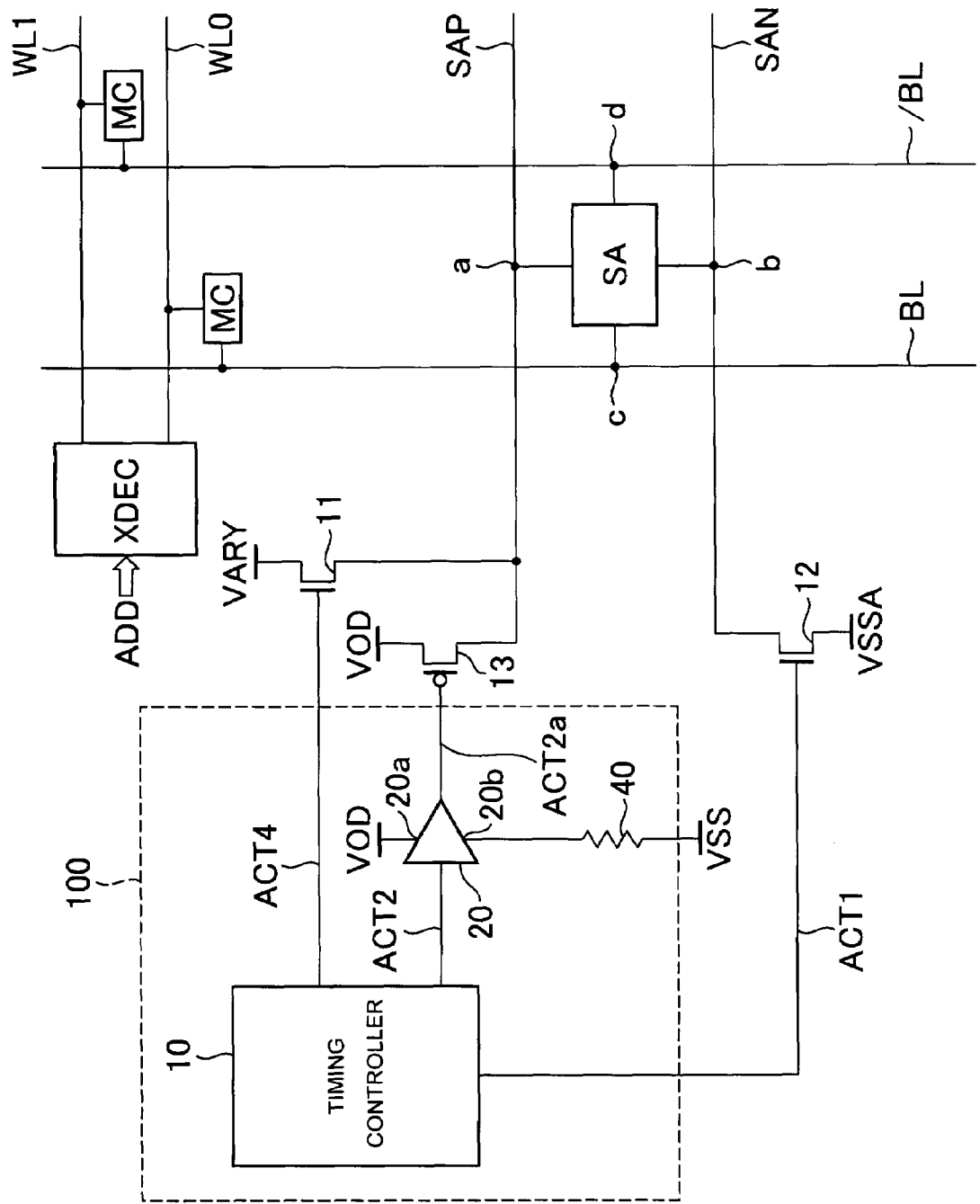
FIG. 5 is a circuit diagram showing principal constituent elements of a semiconductor memory device according to a second embodiment of the present invention.

FIG. 5 is a circuit diagram showing principal constituent elements of the semiconductor memory device according to the second embodiment.

The semiconductor memory device according to the second embodiment differs from that according to the first embodiment in that the switching circuit 30 included in the control circuit 100 is replaced by a resistor 40. Remaining constituent elements of the semiconductor memory device according to the second embodiment are the same as those of the semiconductor memory device according to the first embodiment. In FIG. 5, therefore, like constituent elements as those shown in FIG. 1 are denoted by like reference characters, and redundant explanations will be omitted.

As shown in FIG. 5, the resistor 40 employed in the second embodiment is connected between the power supply node 20b of the driver circuit 20 and the wiring to which the ground potential VSS is supplied. A configuration of the resistor 40 is not limited to a specific one as long as the resistor 40 has a resistance sufficiently higher than an unavoidable wiring resistance. Therefore, the resistance of the resistor 40 may be secured by using a high resistance material as a material of the resistor 40 or by meandering a wiring pattern. Furthermore, the resistance of the resistor 40 may be secured by designing a wiring pattern for connecting the power supply node 20b to the wiring to which the ground potential VSS is supplied to be sufficiently finer than an ordinary wiring pattern.

Figure 6:
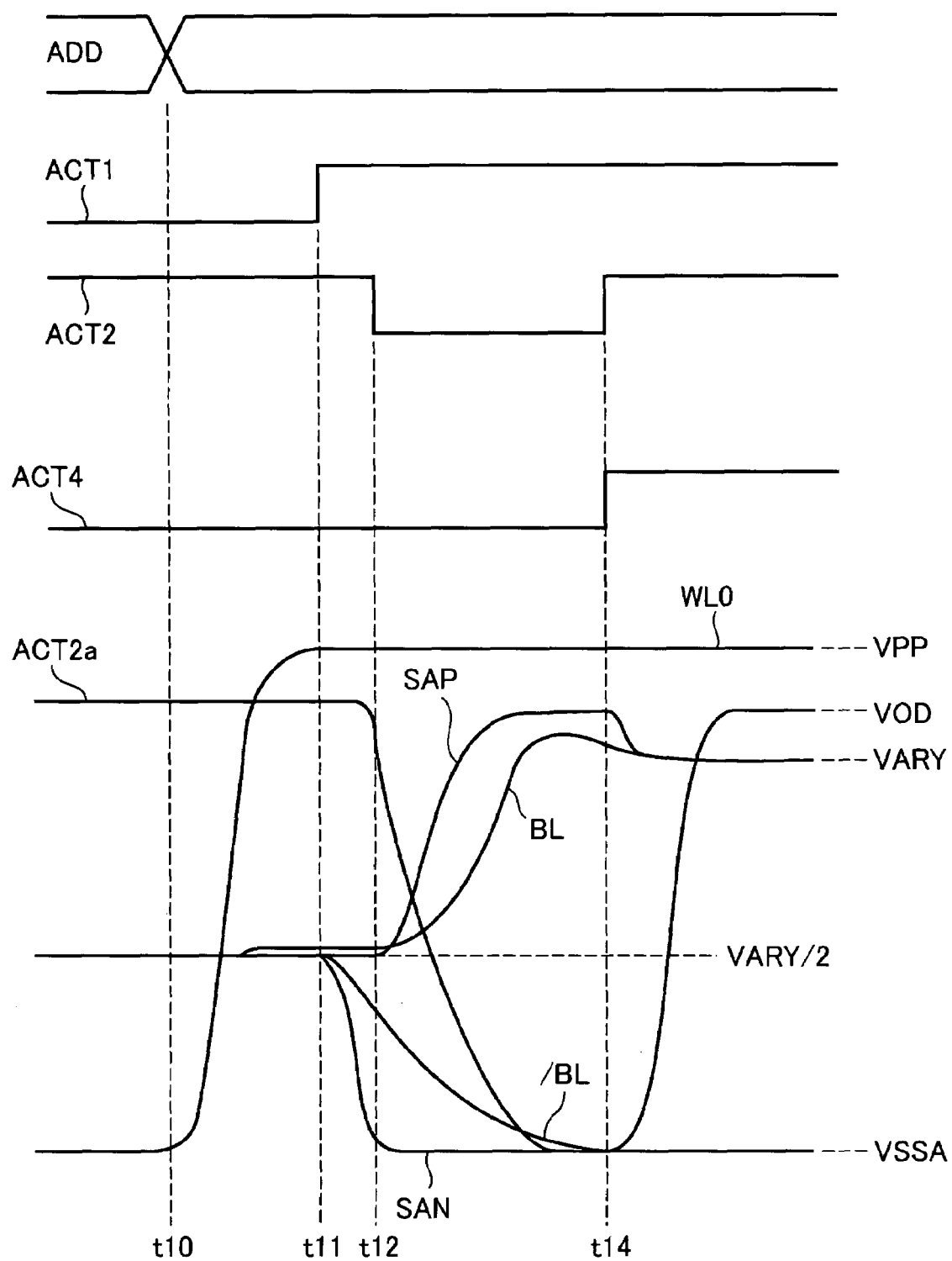
FIG. 6 is a waveform view showing an operation performed by the semiconductor memory device according to the second embodiment of the present invention.

FIG. 6 is a waveform view showing an operation performed by the semiconductor memory device according to the second embodiment.

As shown in FIG. 6, according to the second embodiment, when the activation signal ACT2 is activated to low level at time t12, the output signal ACT2a of the driver circuit 20 gently falls to the ground potential VSS. A speed at which the output signal ACT2a falls is adjustable by the resistance of the resistor 40.

In the second embodiment, the gate-source voltage of the overdrive transistor 13 is thereby continuously changed. The driving capability of the overdrive transistor 13 is, therefore, gradually improved. Similarly to the first embodiment, therefore, generation of noise due to the overdrive operation is suppressed.

A speed at which the driving capability of the overdrive transistor 13 is changed is adjustable by the resistance of the resistor 40. Therefore, if an upper wiring layer is employed as the wiring pattern for connecting the power supply node 20b to the wiring to which the ground potential VSS is supplied and the resistor 40 is added by narrowing a part of the upper wiring layer, the speed of changing the driving capability of the overdrive transistor 13 can be adjusted only by slightly changing the mask pattern of the upper wiring layer.

A semiconductor memory device according to a third embodiment of the present invention will be explained next.

Figure 7:
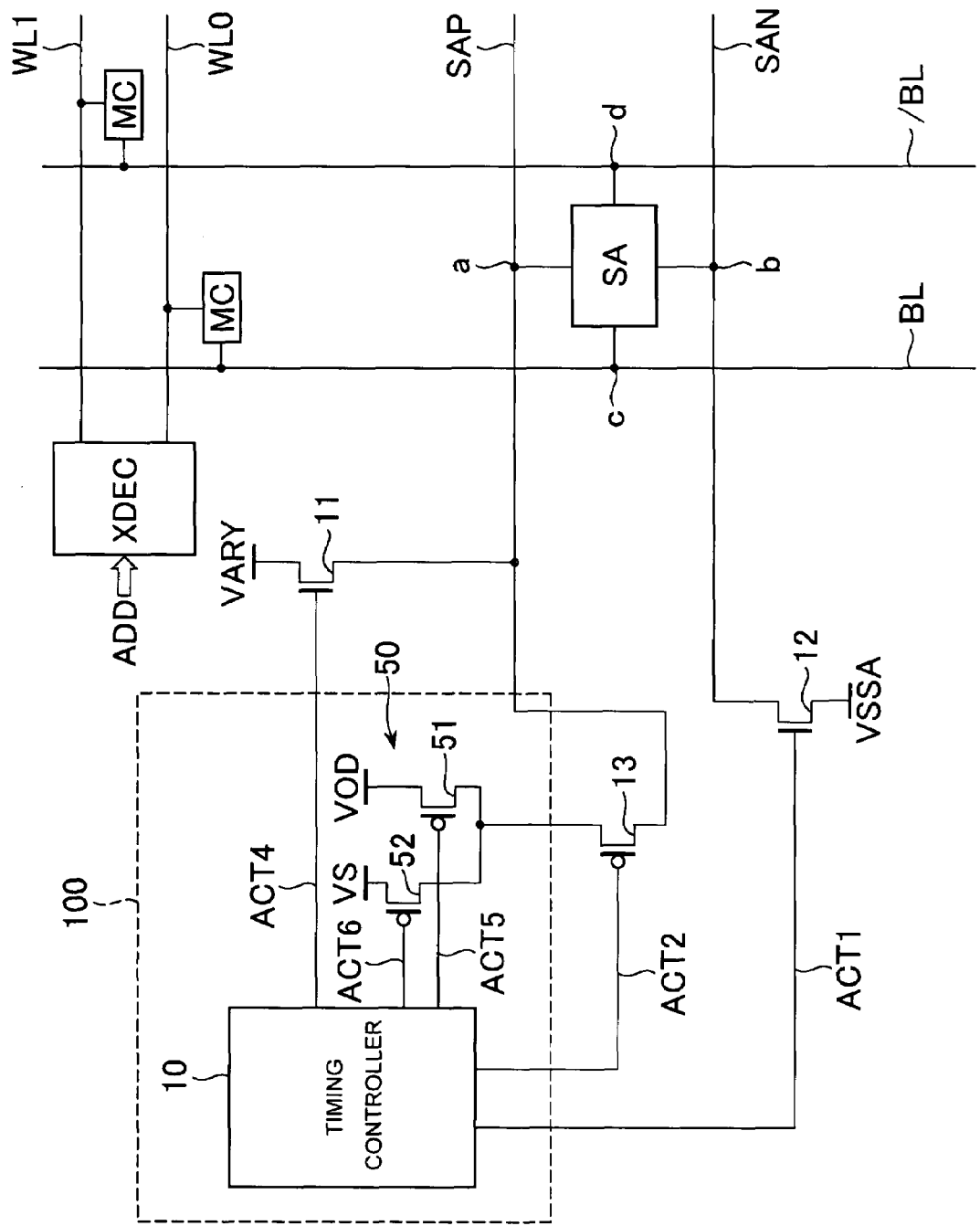
FIG. 7 is a circuit diagram showing principal constituent elements of a semiconductor memory device according to a third embodiment of the present invention.

FIG. 7 is a circuit diagram showing principal constituent elements of the semiconductor memory device according to the third embodiment.

The semiconductor memory device according to the third embodiment differs from that according to the first embodiment in that the driver circuit 20 and the switching circuit 30 are eliminated from the control circuit 100 and a switching circuit 50 is included in the control circuit 100. Remaining constituent elements of the semiconductor memory device according to the third embodiment are the same as those according to the first embodiment. In FIG. 7, therefore, the same constituent elements as those shown in FIG. 1 are denoted by like reference characters, and redundant explanations will be omitted.

As shown in FIG. 7, the switching circuit 50 employed in the third embodiment includes a power supply transistor 50 connected between the wiring to which the overdrive potential VOD is supplied and the overdrive transistor 13, and a power supply transistor 52 connected between a wiring to which an auxiliary potential VS is supplied and the overdrive transistor 13. An activation signal ACT5 is supplied from the timing controller 10 to a gate of the power supply transistor 51, and an activation signal ACT6 is supplied from the timing controller 10 to a gate of the power supply transistor 52.

The auxiliary potential VS is lower than the overdrive potential VOD and preferably higher than the higher write potential VARY. Nevertheless, the auxiliary potential VS may be equal to the higher write potential VARY.

Figure 8:
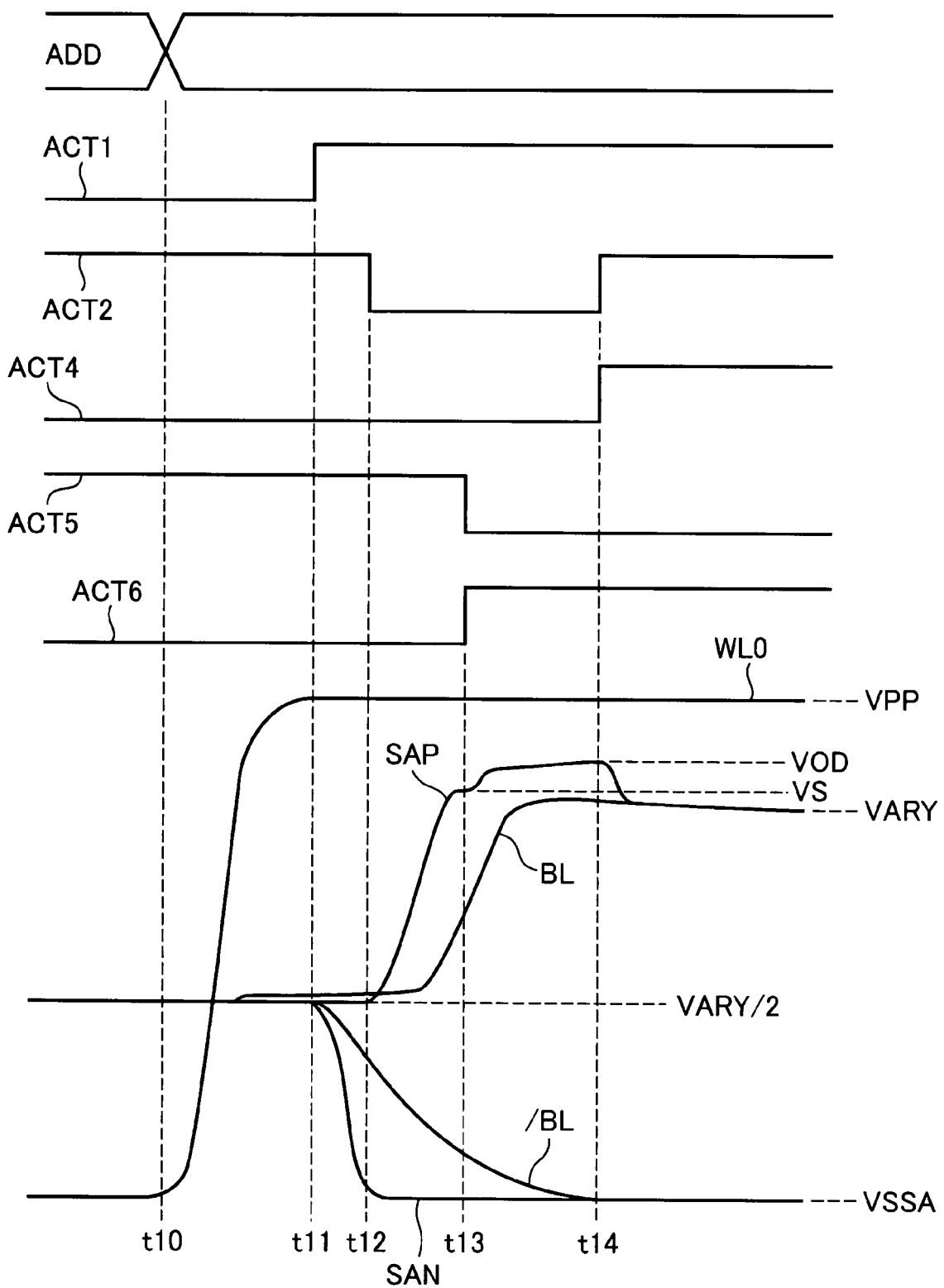
FIG. 8 is a waveform view showing an operation performed by the semiconductor memory device according to the third embodiment of the present invention.
Figure 9:
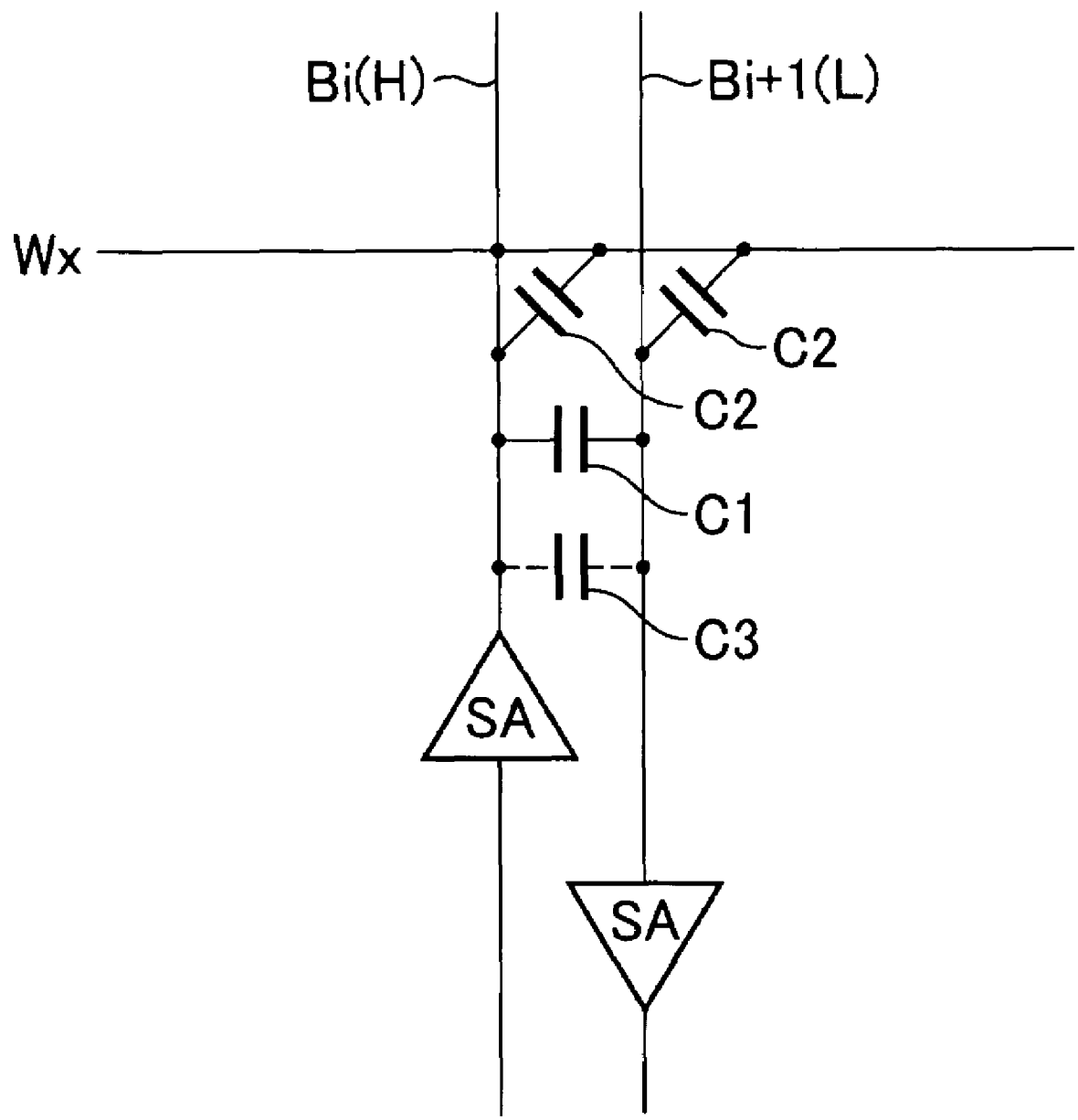
FIG. 9 is a schematic diagram for explaining the interference between paired bit lines.

FIG. 8 is a waveform view showing an operation performed by the semiconductor memory device according to the third embodiment.

As shown in FIG. 8, before time t13, the activation signal ACT5 is at high level and the activation signal ACT6 is at low level. Before the time t13, therefore, the auxiliary potential VS is applied to a source of the overdrive transistor 13. Due to this, when the overdrive transistor 13 is turned on at time t12, the higher-potential drive wiring SAP is connected to the auxiliary potential VS via the overdrive transistor 13. As described above, the auxiliary potential VS is lower than the overdrive potential VOD. The higher-potential drive wiring SAP is, therefore, driven relatively gently.

At the time t13, the activation signal ACT5 is changed to low level and the activation signal ACT6 is changed to high level. A source potential of the overdrive transistor 13 is thereby switched to the overdrive potential VOD, so that the higher-potential drive wiring SAP is driven to the overdrive potential VOD. As a result, the higher-potential drive wiring SAP is driven more strongly and the sensing operation further proceeds.

As described above, in the third embodiment, the source potential of the overdrive transistor 13 is switched, whereby the source-gate voltage of the overdrive transistor 13 is changed in the two-step manner. By adopting such a method, generation of noise in the initial period of the overdrive operation is suppressed. It is, therefore, possible to realize a high-speed sensing operation while preventing data inversion caused by noise.

The present invention is in no way limited to the aforementioned embodiments, but rather various modifications are possible within the scope of the invention as recited in the claims, and naturally these modifications are included within the scope of the invention.

For example, the case where the semiconductor memory device is the DRAM has been described in each of the first to third embodiments. However, the semiconductor memory device according to the present invention is not limited to the DRAM. The invention is also applicable to any other semiconductor memory device as long as it includes sense amplifiers.

Moreover, in the first and third embodiments, the gate-source voltage of the overdrive transistor 13 is changed in the two-step manner. Alternatively, the gate-source voltage of the overdrive transistor 13 can be changed in a manner of three or more steps.

Furthermore, in the third embodiment, the source potential of the overdrive transistor 13 is changed step by step. Alternatively, the source potential of the overdrive transistor 13 may be changed continuously. In this case, the semiconductor memory device may be configured so that the source potential of the overdrive transistor 13 is gradually higher after the overdrive transistor 13 is turned on.

Further, in the third embodiment, the overdrive transistor 13 may be eliminated. However, if the overdrive transistor 13 is eliminated in the third embodiment, then it is necessary to lead all of the higher write potential VARY, the overdrive potential VOD, and the auxiliary potential VS into a sense amplifier region, and the number of transistors to be arranged in the sense amplifier region increases. Considering these respects, the semiconductor memory device is preferably configured as described in the third embodiment.

Moreover, in each of the embodiments explained above, the P-channel MOS transistor is used as the overdrive transistor 13. However, in the present invention, the overdrive transistor 13 is not limited to the P-channel MOS transistor. Alternatively, an N-channel MOS transistor can be used as the overdrive transistor 13. In this case, a side of the overdrive transistor 13 connected to the higher-potential drive wiring SAP serves as a source and a side connected to the power supply serves as a drain. Accordingly, the gate-source voltage of the overdrive transistor 13 may be changed either step by step or continuously.

As described above, according to the present invention, generation of noise caused by an overdrive operation is suppressed. It is, therefore, possible to realize a high-speed sensing operation while preventing data inversion.

What is claimed is:

1. A semiconductor memory device comprising:
   a sense amplifier that supplies a higher write potential to one of a pair of bit line and supplies a lower write potential to other bit line;
   a first driver transistor that supplies the higher write potential to the sense amplifier;
   a second driver transistor that supplies the lower write potential to the sense amplifier;
   an overdrive transistor that supplies an overdrive potential higher than the higher write potential to the sense amplifier; and
   a control circuit that controls the first driver transistor, the second driver transistor, and the overdrive transistor,
   the control circuit changes at least one of a gate-source voltage and a gate-drain voltage of the overdrive transistor either step by step or continuously.

2. The semiconductor memory device as claimed in claim 1, wherein
   the overdrive transistor is connected between a wiring to which the overdrive potential is supplied and the sense amplifier, and
   the control circuit changes a gate potential of the overdrive transistor either step by step or continuously.

3. The semiconductor memory device as claimed in claim 2, wherein
   the control circuit includes
   a driver circuit having an output connected to a gate of the overdrive transistor; and
   a voltage change circuit that changes a power supply voltage of the driver circuit either step by step or continuously.

4. The semiconductor memory device as claimed in claim 3, wherein
   the voltage change circuit includes a switching circuit that switches at least one of power supply potentials of the driver circuit step by step, thereby changing the gate potential of the overdrive transistor step by step.

5. The semiconductor memory device as claimed in claim 3, wherein
   the voltage change circuit includes a resistance connected between the driver circuit and a wiring to which at least one of power supply potentials of the driver circuit is supplied, thereby continuously changing the gate potential of the overdrive transistor.

6. The semiconductor memory device as claimed in claim 1, wherein
   one end of the overdrive transistor is connected to the sense amplifier, and
   the control circuit changes a potential of other end of the overdrive transistor either step by step or continuously.

7. The semiconductor memory device as claimed in claim 6, wherein
   the control circuit includes
   a first power supply transistor connected between a wiring to which the overdrive potential is supplied and the overdrive transistor; and
   a second power supply transistor connected between a wiring to which an auxiliary potential lower than the overdrive potential is supplied and the overdrive transistor, and
   the second power supply transistor is turned on before the first power supply transistor is turned on.

8. The semiconductor memory device as claimed in claim 7, wherein the auxiliary potential is higher than the higher write potential.

9. The semiconductor memory device as claimed in claim 1, wherein
the control circuit controls the second driver transistor, the overdrive transistor, and the first driver transistor to be sequentially turned on in order.

10. A semiconductor memory device comprising:
a sense amplifier that supplies a higher write potential to one of a pair of bit lines and that supplies a lower write potential to other bit line;
a higher-potential drive wiring and a lower-potential drive wiring connected to the sense amplifier;
a first driver circuit that receives the higher write potential, an overdrive potential higher than the higher write potential, and an auxiliary potential lower than the overdrive potential, and sequentially applies the auxiliary potential, the overdrive potential, and the higher write potential to the higher-potential drive wiring in order; and
a second driver circuit that applies the lower write potential to the lower-potential drive wiring upon receiving the lower write potential.

11. The semiconductor memory device as claimed in claim 10, wherein
the auxiliary potential is higher than the higher write potential.

* * * * *